United States Patent [19]

Hermann et al.

[11] Patent Number: 4,857,504
[45] Date of Patent: Aug. 15, 1989

[54] MELT-PRODUCED HIGH TEMPERATURE RARE EARTH BARIUM COPPER OXIDE SUPERCONDUCTOR AND PROCESSES FOR MAKING SAME

[75] Inventors: Allen M. Hermann; Zhengzhi Sheng, both of Fayetteville, Ark.

[73] Assignee: University of Arkansas, Fayetteville, Ark.

[21] Appl. No.: 89,067

[22] Filed: Aug. 25, 1987

[51] Int. Cl.$^4$ .................. C01F 17/00; C01G 3/02; C04B 35/62; H01L 39/12

[52] U.S. Cl. ..................... 505/1; 156/DIG. 63; 252/518; 252/521; 423/263; 423/593; 423/604; 423/636; 501/123; 501/152; 505/809; 505/810; 505/815; 505/822

[58] Field of Search ............. 252/518, 521; 423/263, 423/593, 604, 636, DIG. 12; 501/123, 152; 156/DIG. 63; 505/1, 809, 810, 815, 822

[56] References Cited

PUBLICATIONS

Frase, K. G. et al., "Phase Incompatibilities in the System $Y_2O_3$-BaO-CuO", Adv. Ceramic Matls., vol. 12, No. 3B, Special Issue, Jul. 1987, pp. 295-302.

Roth, R. S. et al., "Phase Equilibria . . . Ba-Y-Cu-O", Adv. Ceramic Matls., vol. 2, No. 3B, Special Issue, Jul. 1987, pp. 303-312.

Wang, G. et al., "950° C. Subsolidus Phase Diagram . . . Air", Adv. Ceramic Matls., vol. 2, No. 3B, Special Issue, Jul. 1987, pp. 313-326.

B. Bender et al., "Processing and Properties of the High $T_c$ Superconducting Oxide Ceramic $YBa_2Cu_3O_7$", Advanced Ceramic Materials, vol. 2, No. 3B, Jul. '87.

Hasegawa, T., High Tc Superconductivity of ($La_{1-x}Sr_x)_2CuO_4$-Effect of Substitution of Foreign Ions for Cu and La on Superconductivity, Japan Journal Applied Physcis, 26, No. 4, Apr. 20, 1987, L-337-338.

Kishio, K., Effect of Lanthanide Ion Substitutions for Lanthanum Sites on Superconductivity of $(La_{1-x}Sr_x)_2CuO_4S$, Japan Journal of Applied Physics, 26, No. 4, Apr. 20, 1987, L391-L393.

Ohsima, S., Superconducting and Structural Properties of the New $Ba_{1-x}Ln_xCuO_{3-y}$ Compound System (Ln=La, Ce, Pr, Nd, Sm, Eu, Gd, Tb, Dy, Ho, Er, and Yb), Japan Journal Applied Physics, 26, No. 5, May 20, 1987, L815-L817).

Tsurumi, S., High Tc Superconductivities of $A_2Ba_4$-$Cu_6O_{14}$, Japan Journal Applied Physics, 26, No. 5, L856-857.

Superconductivity News, vol. 1, No. 2, Aug. 1987, pp. 1, 2, and 6-8.

K. N. Yang, High Temperature Superconductivity in Rare Earth (R)-Barium Copper Oxides ($RBa_2$)-$Cu_3O_9$-S, Solid State Communications, vol. 63, No. 6, pp. 515-519, (1987).

J. M. Tarascon, Oxygen and Rare-Earth Doping of the 90-K Superconducting Perovskite $YBa_2Cu_3O_{7-x}$, The American Physical Society, 1987, vol. 36, No. 1.

P. H. Hor, Superconductivity Above 90 K in the Square-Planar Compound System $ABa_2Cu_3O_{6+x}$ with A=Y, La, Nd, Sm, Eu, Gd, Ho, Er, and Lu, The American Physical Society, 1987, vol. 58, No. 18.

A. Khurana, Suerpconductivity Seen Above the Boiling Point of Nitrogen, Physics Today, Apr. 1987.

R. J. Cava, Bulk Superconductivity of 91 K in Single-Phase Oxygen-Deficient Perovskite $Ba_2YCu_3O_{9-S}$, The American Physcial Society, 1987, vol. 58, No. 16.

Primary Examiner—Dennis Albrecht
Attorney, Agent, or Firm—Hill, Van Santen, Steadman & Simpson

[57] ABSTRACT

A class of melt-produced, high temperature suerpconductors and processes of making same are provided. The superconductor has a preferred composition of R-Ba-Cu-O wherein R is chosen from the group of rare earth metals excluding: Praseodyium; Cerium; and Terbium. The process is carried out at a relatively low temperature of about 950° C., and the process allows fabrication of melt-produced high temperature superconductors of arbitrary shape. The process is based on the reaction between molten barium-copper oxides and solid rare earth oxides, rare earth barium oxides, rare earth copper oxides, or rare earth barium-copper oxides. In an embodiment, the method comprises the steps of: mixing and grinding $BaCO_3$ and CuO with other nominal compositions; pressing the resultant mixture into a pellet, if necessary; placing the pellet or powder on a pellet or powder that can include rare earth copper oxides; heating the pellet and/or powders to a temperature of approximately 950° C.; and removing a melt-produced superconductor from the remaining powder or pellet.

35 Claims, 1 Drawing Sheet

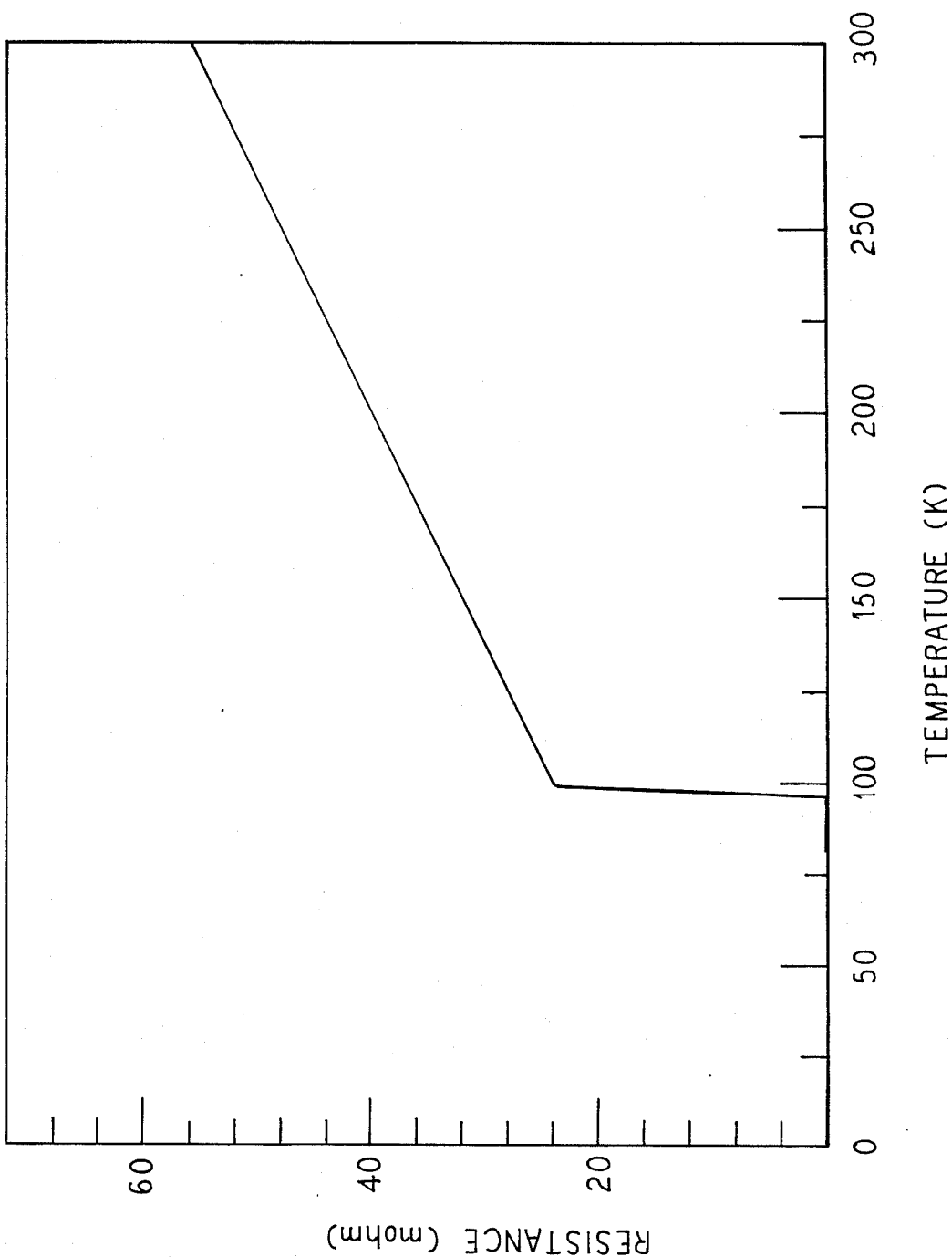

MELT-PRODUCED HIGH TEMPERATURE RARE EARTH BARIUM COPPER OXIDE SUPERCONDUCTOR AND PROCESSES FOR MAKING SAME

BACKGROUND OF THE INVENTION

The present invention relates generally to high temperature superconductors. More specifically, the present invention relates to a melt-produced, high temperature superconductor and processes for making same.

Recently, there has been much work done on the utilization of ternary oxides containing copper, barium, and rare earth elements for superconductivity at temperatures above 90° K. with the belief that superconductivity at or above room temperature is possible. Some of this work has centered on the utilization of a yttrium (Y)-barium (Ba)-copper (Cu)-oxygen (O) system.

Current developments of the Y-Ba-Cu-O class of ceramic superconductors have yielded optimistic results. These systems are typically created utilizing bulk materials which are powders or very small granule substances. These powders must be compressed to facilitate measurements and are relatively intractable. As can be appreciated, the structure of these substances is not conductive to the manufacturing of components from these ceramic superconductors.

A melt-produced, high temperature superconductor would be desirable for many reasons. Melt-produced superconductors would: (1) allow the growth of large bulk single crystals—this is important because it could facilitate the discovery of the correct theory on superconductivity; (2) provide low cost processing and manufacturability; (3) allow components to be cast in any shape; (4) allow the addition of other components to the melt-produced high temperature superconductors—this would allow one to create an extrudeable composition allowing the superconductor to be useful in the manufacture of superconducting wires, magnets, etc.; and (5) the inventors believe, allow for high critical currents in the high temperature superconductor allowing the generation of large currents therethrough.

Accordingly, there is a need for melt-produced high temperature superconductors and processes for making same.

SUMMARY OF THE INVENTION

The present invention provides melt-produced high temperature superconductors and processes for making same that are unique to date among high temperature superconductors.

The present invention preferably comprises a composition having the following formula:

R-Ba—Cu-O wherein:
R is chosen from the group of rare earth metals excluding: Praseodymium (Pr); Cerium (Ce); and Terbium (Tb).
Preferably, R is chosen from the group of rare earth metals that include: Yttrium (Y); Gadolinium (Gd); Erbium (Er); Holmium (Ho); Neodymium (Nd); Samarium (Sm); Europium (Eu); Ytterbium (Yb); Dysprosium (Dy); Thulium (Tm); and Lutetium (Lu). In a preferred embodiment, R is Yttrium.

In a preferred embodiment, the melt-produced superconductor has the following nominal stoichiometry:

$RBa_2Cu_3O_{6.5}$ wherein:
R is a rare earth metal not including: Pr; Tb; or Ce. Preferably, R is chosen from the group of rare earth metals that include: Yttrium (Y); Gadolinium (Gd); Erbium (Er); Holmium (Ho); Neodymium (Nd); Samarium (Sm); Europium (Eu); Ytterbium (Yb); Dysprosium (Dy); Thulium (Tm); and Lutetium (Lu).

In a preferred embodiment, the melt-produced superconductors has the following nominal stoichiometry:

$YBa_2Cu_3O_{6.5}.$

A method of making the melt-produced, high temperature superconductors is also provided. The method is based on a reaction between molten Ba-Cu oxides and solid rare earth oxides, rare earth barium oxides, rare earth copper oxides, or rare earth-Ba-Cu oxides. The method allows melt-producing to be carried out at a relatively low temperature of approximately 950° C. The method further allows the use of precursor materials for the superconductor in the form of pellets, powders, or pellets and powders.

The method comprises the steps of: mixing and grinding $BaCO_3$ and $CuO$ with nominal compositions of $Ba_2Cu_3O_5$, $BaCu_3O_4$, $BaCu_4O_5$, $BaCu_6O_7$, and $BaCu_{1.2}O_{13}$; pressing the resultant mixture into a pellet, if necessary; placing the pellet or powder on a pellet or powder chosen from the group consisting of $R_2O_3$, or RBa-oxides (e.g. $RBaO_{2.5}$), R-Cu-oxides, or R-Ba-Cu-oxides (e.g. $R_{1.2}Ba_{0.8}CuO_{3.6}$) wherein R is chosen from the group of rare earth metals excluding: Tb, Pr, and Ce; heating the pellets and/or powders to a temperature of approximately 950° C.; and removing a melt-produced superconductor from the remaining pellet or powder at the bottom.

In an embodiment of the method, a mixture of $BaCO_3$ and $CuO$ with nominal composition of $BaCu_3O_4$ is ground and heated to approximately 900° C. in air for about 12 hours. The heated mixture is reground and pressed into pellets. A mixture of $Y_2O_3$, $BaCO_3$, and $CuO$ with nominal composition of $Y_{1.2}Ba_{0.8}CuO_{3.6}$ is ground and heated at approximately 950° C. in air for about 12 hours. The resultant material is reground. The black $BaCu_3O_4$ pellet (of arbitrary shape) is placed on the (green) $Y_{1.2}Ba_{0.8}CuO_{3.6}$ powder, and is heated in flowing $O_2$ at about 950° C. for 12 hours, then at 650° C. for 4 hours, then cooled down to 200° C. in about 1–2 hours, then removed from the furnace. A black melt-produced superconductor is formed which is embedded in the (green) $Y_{1.2}Ba_{0.8}CuO_{3.6}$ powder and separated from it (the recovered $Y_{1.2}Ba_{0.8}CuO_{3.6}$ powder may be reused if desired).

Accordingly, an advantage of the present invention is to provide a melt-produced, high temperature superconductor and method of making same.

A further advantage of the present invention is to provide a method that affords the ability to grow large single crystals of this supeconductor.

A still further advantage of the present invention is that it provides a melt-produced, high temperature superconductor that is easily formable and manufacturable allowing it to be utilized in commercial applications.

Furthermore, an advantage of the present invention is that it provides a melt-produced, high temperature superconductor to which other components can be added to make, for example, wire-type high temperature superconductors.

Still another advantage of the present invention is that it provides a high temperature superconductor having high critical currents.

Moreover, an advantage of the present invention is that it provides a high temperature superconductor that can be used to carry high currents without energy loss.

A further advantage of the present invention is that it provides a method for making melt-produced, high temperature superconductors at relatively low temperatures of about 950° C.

A still further advantage of the present invention is that it provides a supeconductor that can be utilized to levitate vehicles, store energy in magnetic fields, and produce more intense magnetic fields than heretofore possible.

Additional advantages and features of the present invention are described in, and will be apparent from, the detailed description of the presently preferred embodiments.

BRIEF DESCRIPTION OF THE DRAWING

The FIG. illustrates the resistance of a sample of a superconductor made by the method of the present invention as a function of temperature.

DETAILED DESCRIPTION OF THE PRESENTLY PREFERRED EMBODIMENTS

The present invention provides a melt-produced, high temperature superconductor and process for making same. As used herein, the term "high temperature" refers to a temperature above the boiling temperature of nitrogen.

It has been found that the melt-produced, high temperature supeconductor of the present invention upon reaction of the molten and solid constituents is superconducting with a critical temperature of at least 90° K.

The melt-produced, high temperature superconductor composition of the present invention preferably has the formula:

R-Ba—Cu-O wherein:
R is chosen from the group of rare earth metals excluding: Praseodymium (Pr); Terbium (Tb); and Cerium (Ce).

Preferably, R is a rare earth metal chosen from the group consisting of: Yttrium (Y); Gadolinium (Gd); Erbirum (Er); Holmium (Ho); Neodymium (Nd); Samarium (Sm); Europium (Eu); Ytterbium (Yb); Dysoprosium (Dy); Thulium (Tm); and Lutetium (Lu).

In a preferred embodiment, R is Yttrium.

Preferably, the melt-produced, high temperature superconductor has the following nominal stoichiometry:

$RBa_2Cu_3O_{6.5}$ wherein:
R is a rare earth metal exlucing: Tb; Pr; and Ce and preferably: Y; Gd; Er; Ho; Nd; Sm; Eu; Yb; Dy; Tm; and Lu.

In a preferred embodiment, the melt produced, high temperature supeconductor has the following nominal stoichiometry:

$YBa_2Cu_3O_{6.5}$.

The present invention provides methods for making meltproduced high temperature superconductors at temperatures as low as 950° C.

By way of example, and not limitation, examples of the methods of making the melt-produced, high temperature superconductors will now be given.

EXAMPLE 1

A. $Y_2O_3$, $BaCO_3$, and $CuO$ with nominal compositions of $Ba_2Cu_3O_5$ and $Y_{1.2}Ba_{0.8}CuO_{3.6}$ were mixed and ground in an agate mortar. The powders were heated to approximately 900° C. in air for approximately 12 to about 24 hours.

B. The heated mixtures were then reground. The resultant $Ba_2Cu_3O_5$ powder was then pressed into a pellet. The $Ba_2Cu_3O_5$ pellet was then placed on the $Y_{1.2}Ba_{0.8}CuO_{3.6}$ powder. The pellet and powder were then heated at approximately 950° C. in flowing oxygen, for approximately 24 hours in a tube furnace. The tube furnace was then cooled to approximately 650° C. and remained at that temperature for approximately 2 to about 4 hours. The tube furnace was then cooled to approximately 200° C. before the pellet and powder were removed from the furnace.

C. During the heating process, part of the $Ba_2Cu_3O_5$ pellet method into the $Y_{1.2}Ba_{0.8}CuO_{3.6}$ powder. This melt-produced material was black in color and was superconductive.

The figure illustrates resistance (as a function of temperature) of the melt-produced superconductor embedded in the powder. It is seen that the superconductor has a high transition temperature. Specifically, the midpoint transition temperature is 93° K and the transition width is about 2° K.

The superconductive material had a high density of approximately 6.4 grams per cm³. X-ray diffraction showed that the superconductor consisted of $YBa_2Cu_3O_{6.5}$ (nominal composition) with very little $CuO$ as an impurity. The melt-produced, superconductor demonstrated a strong Meissner effect and levitated in a magnetic field of 8 kiloGauss.

EXAMPLE 2

An experiment was performed to find a Ba-Cu-oxide system with a low melt point. It should be noted that in the previous example, at 950° C., more than half of $Ba_2Cu_3O_5$ did not melt. In order to search for a Ba-Cu-oxide system with a lower melting point, the following experiment was performed.

A. $CuO$ or mixtures of $BaCO_3$ and $CuO$ with nominal compositions of $Ba_3Cu_2O_5$, $Ba_2Cu_3O_5$, $BaCu_3O_4$, $BaCu_4O_5$, $BaCu_6O_7$, $BaCU_{12}O_{13}$, and $BaCu_{48}O_{49}$, were weighed and ground in an agate mortar.

B. The resultant powders were heated in air at 950° C. for approximately 8 hours.

The experiment demonstrated that $BaCU_3O_4$ and $BaCU_4O_5$ are the Ba-Cu-oxides with the lowest melting points. To this end, these powders were essentially completely melted at 950° C.

EXAMPLE 3

A. A mixture of $BaCO_3$ and CuO with a nominal composition of $BaCU_3O_4$ was ground in an agate mortar, and pressed into a pellet.

B. The resultant pellet was put on a powder consisting of $Y_{1.2}Ba_{0.8}CuO_{3.6}$ (nominal composition) that had been heated at approximately 950° C. The pellet and powder were then heated at approximately 950° C. in flowing $O_2$ for approximately 24 hours in a tube furnace. The furnace was then cooled to approximately 650° C. and remained at 650° C. for about 2 to about 4 hours. The furnace was then turned off, and, when the furnace temperature was below 200° C., the pellet and powder were removed from the furnace.

After removing the heated materials from the furnace it was noted that the $BaCu_3O_4$ pellet had almost completely melted into the powder. A black chunk of superconductor material was formed, embedded in the remaining $Y_{1.2}Ba_{0.8}CuO_{3.6}$ powder that was green in color. This superconductor had properties similar to those of Example No. 1.

EXAMPLE 4

A. A mixture of $BaCO_3$ and CuO with a nominal composition of $BaCU_3O_4$ was ground in an agate mortar. The resultant powder was then pressed into a pellet.

B. A mixture of $Y_2O_3$ and CuO with a nominal composition $YBaO_{2.5}$ was also ground.

C. The $BaCu_3O_4$ pellet was put on the resultant $YBaO_{2.5}$ powder of Step B and heated at 950° C. in flowing $O_2$ for approximately 24 hours in a tube furnace. The temperature of the furnace was then reduced to 650° C. and the pellet and powder were left in the furnace at this temperature for approximately 2 to about 4 hours. The furnace was then cooled to approximately 200° C. before the pellet and powder were removed from the furnace.

The $BaCu_3O_4$ pellet was almost completely melted into the powder. This resulted in a black chunk of superconductor being formed, that was embedded in the remaining white $YBaO_{2.5}$ powder. This superconductor had properties similar to those of Example No. 1.

EXAMPLE 5

A. A $Ba_2Cu_3O_5$ pellet was put on a powder that consisted of $Y_2O_3$. The pellet and powder were heated at 950° C. in flowing $O_2$ for approximately 12 to about 24 hours in a tube furnace. The temperature of the furnace was reduced to 650° C. and the pellet and powder remained therein for approximately 2 to about 4 hours. The furnace was then cooled to 200° C. before the pellet and powder were removed from the furnace.

A part of the $Ba_2Cu_3O_5$ pellet was melted. The interface between the $Ba_2Cu_3O_5$ pellet and $Y_2O_3$ powder contained a black piece of melt-produced material. The material was found to have superconductive properties.

EXAMPLE 6

A. A $Ba_2Cu_3O_5$ pellet was placed on $YBa_2Cu_3O_{4.5}F_4$ powder which had been heated to approximately 950° C. The pellet and powder were heated to approximately 950° C. in flowing $O_2$ for approximately 24 hours in a tube furnace. The furnace was cooled to 650° C. and the pellet and powder remained therein for approximately 2 to about 4 hours. The furnace was cooled to 200° C. before the pellet and powder were removed from the furnace.

A part of the $Ba_2Cu_3O_5$ pellet was melted into the powder. A black piece of superconductor was formed in the interface of the pellet and the powder. This superconductor had properties similar to those of Example No. 1.

EXAMPLE 7

In this example, superconductors were created from a $Ba_2Cu_3O_5$ pellet melted into a powder with nominal composition $R_{1.2}Ba_{0.8}CuO_{3.6}$ wherein R is a rare earth chosen from the group consisting of: Nd; Sm; Eu; and Dy.

A. $BaCO_3$ and CuO with a nominal composition of $Ba_2Cu_3O_5$ were ground and heated in air at approximately 900° C. for 12 hours. The mixture was then reground and pressed into pellets.

B. $R_2O_3$ (wherein R is chosen from the group consisting of: Nd; Sm; Eu; and Dy), $BaCO_3$ and CuO with a nominal composition of $R_{1.2}Ba_{0.8}CuO_{3.6}$ were ground and heted in air at approximately 950° C. for 12 hours and then cooled down to less than 200° C., and reground.

C. A $Ba_2Cu_3O_5$ pellet was put on the resultant $R_{1.2}Ba_{0.8}CuO_{3.6}$ powder, and heated in $O_2$ at approximately 950° C. for approximately 15 hours in a tube furnace. The furnace was then cooled to approximately 650° C. and the pellet and powder were heated therein for approximately 2 hours. The furnace was then cooled down to 200° C. and the pellet and powder removed.

The $Ba_2Cu_3O_5$ pellet was partly melted, and a black chunk of melt-produced superconductor was formed, which embedded in the remaining $R_{1.2}Ba_{0.8}CuO_{3.6}$ powder. The formed superconductor exhibited properties similar to those exhibited by the superconductors produced in Example No. 1. The superconductors had the following nominal stoichiometry: $RBa_2Cu_3O_{6.5}$, wherein RNd; Sm; Eu; or Dy.

The inventors believe that R=Gd, Ho, Er, Tm, Yb, and Lu would also work to create a superconductor following the steps of the above example.

EXAMPLE 8

A. $R_2O_3$ (wherein R is chosen from the group consisting of: Gd; Ho; Er; and Yb) and $BaCO_3$ with nominal composition of $RBaO_{2.5}$ were ground and heated in air at approximately 950° C. for approximately 6 hours and reground.

B. $BaCO_3$ and CuO with a nominal composition of $BaCu_3O_4$ were ground and pressed into pellets.

C. A $BaCu_3O_4$ pellet was put on an $RBaO_{2.5}$ powder and heated in $O_2$ at approximately 950° C. for approximately 5 hours. The tube furnace was then cooled down to less than 200° C. before the materials were removed from the furnace.

The $BaCu_3O_4$ pellet was almost completely melted, and a black chunk was formed, which was embedded in the remaining $RBaO_{2.5}$ powder. The superconductor had properties similar to the superconductors produced in Example No. 1.

The inventors believe a melt-produced superconductor can also be produced if R=Nd, Sm, Eu, Dy, Tm and Lu and the above steps are followed. EXAMPLE 9

A. $Ho_2O_3$ and $BaCO_3$ with nominal composition of $HoBa_2O_{3.5}$ were ground and heated in air at approximately 950° C. for approximately 6 hours. The mixture was then reground.

B. $BaCO_3$ and CuO with a nominal composition of $BaCu_3O_4$ were ground and pressed into pellets.

C. The resultant $BaCu_3O_4$ pellet was put on $HoBa_2O_{3.5}$ powder, heated in $O_2$ at approximately 950° C. for approximately 5 hours in a tube furnace. The furnace was cooled down to less than 200° C. before the materials were removed from the furnace.

The $BaCu_3O_4$ pellet had almost completely melted, and a black chunk was formed, which was embedded in the remaining $HoBa_2O_{3.5}$ powder. The black chunk had superconductive properties similar to those of the previous examples.

EXAMPLE 10

A. $Ho_2O_3$ and $SrCO_3$ with nominal composition of $HoSrO_{2.5}$ were ground and heated in air at 950° C. for 6 hours and reground.

B. $BaCO_3$ and CuO with a nominal composition of $BaCU_3O_4$ were ground and pressed into pellets.

C. The resultant $BaCu_3O_4$ pellet was put on $HoSrO_{2.5}$ powder, heated in $O_2$ at approximately 950° C. for approximately 5 hours in a tube furnace. The furnace was then cooled down to less than 200° before the pellet and powder were moved out of the furnace.

The $BaCu_3O_4$ pellet was almost completely melted, and a black chunk was formed, which was embedded in the remaining $HoSrO_{2.5}$ powder. The black chunk had superconductive properties similar to those of the previous examples.

EXAMPLE 11

The present example deals with the fabrication of arbitrarily-shaped components made from melt-produced superconductors. The example given is for a ring shape.

A. $BaCO_3$ and CuO with nominal composition of $BaCu_3O_4$ were mixed and ground, and then heated in air at 900° C. for 12 hours. The resultant black material was reground and pressed into pellets (hereafter called Ba-Cu pellets).

B. $Y_2O_3$, $BaCO_3$, and CuO were mixed to a nominal composition of $Y_{1.2}Ba_{0.8}CuO_{3.6}$ and ground, and then heated in air at 950° C. for 12 hours. The resultant (green) material was then powdered (hereafter called $Y_{1.2}$ powder).

C. The $Y_{1.2}$ powder was packed into a crucible and the surface leveled. Ba-Cu pellets were then placed one-by-one onto the $Y_{1.2}$ powder to form a ring shape.

D. The crucible and its contents were then heated in a tube furnace in flowing $O_2$ at 950° C. for about 12 hours, then held at 650° C. for 4 hours, and then cooled down to below 200° C., at which point they were removed from the furnace and cooled to room temperature.

E. A black melt-produced superconductive ring was formed, embedded in the $Y_{1.2}$ (green) powder. The ring was removed from the powder. If desired, the powder could then be reground and used again in similar fashion.

EXAMPLE 12

The present example deals with the fabrication of arbitrarily-shaped components made from melt-produced superconductors.

A. $BaCO_3$ and CuO with nominal composition of $BaCu_3O_4$ were mixed and ground, and then heated in air at 900° C. for 12 hours. The resultant black material was reground.

B. $Y_2O_3$, $BaCO_3$, and CuO were mixed to a nominal composition of $Y_{1.2}Ba_{0.8}CuO_{3.6}$ and ground, and then heated in air at 950° C. for 12 hours. The resultant (green) material was then powdered (hereafter called $Y_{1.2}$ powder).

C. The $Y_{1.2}$ powder was packed into a crucible and the surface leveled. $BaCu_3O_4$ powder was then placed onto the $Y_{1.2}$ powder.

D. The crucible and its contents were then heated in a tube furnace in flowing $O_2$ at 950° C. for about 12 hours, then held at 650° C. for 4 hours, and then cooled down to below 200° C., at which point they were removed from the furnace and cooled to room temperature.

E. A black melt-produced superconductive compound was formed, embedded in the $Y_{1.2}$ (green) powder. The compound was removed from the powder. The powder could then be reground and used again in similar fashion.

EXAMPLE 13

The present example deals with the fabrication of arbitrarily-shaped components made from melt-produced superconductors. The example given is for a ring shape.

A. $BaCO_3$ and CuO with nominal composition of $BaCu_3O_4$ were mixed and ground, and then heated in air at 900° C. for 12 hours. The resultant black material was reground and pressed into a ring (hereafter called $BaCu_3O_4$ ring).

G. $Y_2O_3$, $BaCO_3$, and CuO were mixed to a nominal composition of $Y_{1.2}Ba_{0.8}CuO_{3.6}$ and ground, and then heated in air at 950° C. for 12 hours. The resultant (green) material was then powdered (hereafter called $Y_{1.2}$ powder).

C. The $Y_{1.2}$ powder was packed into a crucible and the surface leveled. The $BaCu_3O_4$ ring was then placed onto the $Y_{1.2}$ powder.

D. The crucible and its contents were then heated in a tube furnace in flowing $O_2$ at 950° C. for about 12 hours, then held at 650° C. for 4 hours, and then cooled down to below 200° C., at which point they were removed from the furnace and cooled to room temperature.

E. A black melt-produced superconductive ring was formed, embedded in the $Y_{1.2}$ (green) powder. The ring was removed from the pocket. The powder could then be reground and used again in similar fashion.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

We claim:

1. A method for making a melt-produced high temperature superconductor comprising the steps of:

mixing and grinding $BaCO_3$ and CuO with nominal compositions of at least one compound chosen from the group consisting of $Ba_2Cu_3O_5$, $BaCu_3O_4$, $BaCu_4O_5$, $BaCu_6O_7$, and $BaCu_{12}O_{13}$;

pressing the resultant mixture into a pellet;

placing the pellet on a powder comprising at least one compound chosen from the group consisting of $R_{1.2}Ba_{0.8}CuO_{3.6}$, $RBa_2Cu_3O_{4.5}F_4$, $RBa_2O_{3.5}$, RBa- $_2O_{2.5}$, or $R_2O_3$ wherein R is chosen from the group of rare earth metals excluding: Tb, Pr, and Ce;

heating the pellet and the powder in a furnace to a temperature of greater than or equal to 950° C. and less than or equal to 1000° C. to form a melt at a pellet:powder interface; and removing the melt-produced superconductor from the powder in which the superconductor is embedded.

2. The method of claim 1 wherein R is chosen from the group of rare earth metals consisting of: Y, Gd, Er, Ho, Nd, Sm, Eu, Yb, Dy, Tm, and Lu.

3. The method of claim 1 wherein the oxide chosen is $BaCu_3O_4$.

4. The method of claim 1 wherein the oxide chosen is $BaCu_4O_5$.

5. The method of claim 1 wherein the oxide chosen is $Ba_2Cu_3O_5$.

6. The method of claim 1 wherein the pellet and powder are heated in the furnace at a temperature between 940° C. to about 1000° C. for approximately 12 to about 24 hours.

7. The method of claim 1 wherein after the pellet and powder are heated to 940°–1000° C. for a predetermined time in the furnace, the temperature of the furnace is lowered to approximately 650° C. and the pellet and mixture remain therein for a predetermined time.

8. The method of claim 7 including the step of cooling the furnace to 200° C. or less before removing the pellet and powder therefrom.

9. The method of claim 1 wherein after the mixing and grinding step of Ba-Cu oxide, the resultant mixture is heated to approximately 850°–920° C.

10. The method of claim 1 wherein the powder on which the Ba-Cu-oxide pellet is placed has been previously heated to approximately 900°–1000° C.

11. A method for making a superconductor comprising the steps of:

mixing and grinding $BaCO_3$ and CuO with nominal compositions of at least one compound chosen from the group consisting of $Ba_2Cu_3O_5$, $BaCu_3O_4$, $BaCu_4O_5$, $BaCu_6O_7$, and $BaCu_{12}O_{13}$;

heating the resultant mixture;

pressing the resultant mixture into a pellet;

placing the pellet on a preheated powder comprising $RBa_2Cu_3O_{4.5}F_4$ wherein R is chosen from the group consisting of: Gd, Ho, Er, Yb, Nd, Sm, Eu, Dy, Tm, and Lu;

heating the pellet and the powder in a furnace to approximately 940° to about 1000° C. to form a melt at a powder:powder interface; and removing a melted interface between the pellet and powder.

12. A method for making a superconductor comprising the steps of:

mixing and grinding $BaCO_3$ and CuO with nominal compositions of at least one compound chosen from the group consisting of $Ba_2Cu_3O_5$, $BaCu_3O_4$, $BaCu_4O_5$, $BaCu_6O_7$, and $BaCu_{12}O_{13}$;

heating the resultant mixture;

pressing the resultant mixture into a pellet;

placing the pellet on a powder that has previously been heated comprising $R_{1.2}Ba_{0.8}CuO_{3.6}$ wherein R is chosen from the group consisting of: Y, Gd, Er, Ho, Nd, Sm, Eu, Yb, Dy, Tm, and Lu;

heating the pellet and the powder in a furnace to a temperature of greater than or equal to 950° C. and less than or equal to 1000° C. to form a melt at a pellet:powder interface; and removing the melt-produced superconductor from the powder in which the superconductor is embedded.

13. The method of claim 12 wherein after the mixing and grinding step, the resultant mixture is heated to approximately 850°–920° C.

14. The method of claim 12 wherein the powder the pellet is placed on has been previously heated to approximately 900°–1000° C.

15. The method of claim 12 wherein after the pellet and powder are heated to 940°–1000° C. for a predetermined time in the furnace, the temperature of the furnace is lowered to approximately 650° C. and the pellet and mixture remain therein for a predetermined time.

16. The method of claim 12 wherein the pellet and powder are heated in the furnace at a temperature between 940° C. to about 1000° C. for approximately 12 to about 24 hours.

17. A method for making a superconductor comprising the steps of:

mixing and grinding $BaCO_3$ and CuO with nominal compositions of at least one compound chosen from the group consisting of $BaCu_3O_5$, $Ba_2Cu_3O_4$, $BaCu_4O_5$, $BaCu_6O_7$, and $BaCu_{12}O_{13}$;

heating the resultant mixture to a temperature of approximately 900° C.;

pressing the resultant mixture into a pellet;

placing the pellet on a preheated powder comprising $Y_{1.2}Ba_{0.8}CuO_{3.6}$;

heating the pellet and the powder in a furnace to a temperature of greater than or equal to 940° C. and less than or equal to 1000° C. for approximately 12 to about 24 hours to form a melt at a pellet:powder interface;

cooling the furnace to approximately 650° C. and heating the pellet and powder therein;

cooling the furnace to at least approximately 200° C.; and removing a melted interface between the pellet and powder.

18. A method for making a superconductor comprising the steps of:

placing a pellet consisting of a compound chosen from the group consisting of $Ba_2Cu_3O_5$, $BaCu_3O_4$, and $BaCu_4O_5$ on a powder consisting of a compound chosen from the group consisting of $RBa_2Cu_3O_{4.5}F_4$, $R_{1.2}Ba_{0.8}CuO_{3.6}$, $R_2O_3$, and $RBa_2O_{3.5}$ wherein R is chosen from the group of rare earth metals excluding Tb, Pr, and Ce;

heating the pellet and powder to approximately 950° C. to about 1000° C. for 12 to 24 hours to form a melt at a pellet:powder interface; and removing a melted interface between the pellet and powder.

19. The method of claim 18 wherein R is chosen from the group of rare earth metals consisting of: Y, Gd, Er, Ho, Nd, Sm, Eu, Yb, Dy, Tm, and Lu.

20. The method of claim 18 wherein R is Y.

21. The method of claim 18 wherein after the pellet and powder are heated to 950°–1000° C. for a predetermined time in the furnace, the temperature of the furnace is lowered to approximately 650° C. and the pellet and the mixture remain therein for a predetermined time.

22. The method of claim 18 including the step of cooling the furnace to 200° C. or less before removing the pellet and powder therefrom.

23. The method of claim 18 wherein the pellet and powder are heated in the furnace at a temperature between 950° C. to about 1000° C. for approximately 12 to about 24 hours.

24. The method of claim 18 wherein the powder the pellet is placed on has been previously heated to approximately 900°–1000° C.

25. A method of making a superconductor comprising the steps of:
   placing a pellet consisting of $BaCu_3O_4$ on a powder consisting of $HoBa_2O_{3.5}$;
   heating the pellet and powder to approximately 940° C. to 1000° C. to form a melt at a pellet:powder interface; and
   removing a melted interface between the pellet and powder.

26. A method of making a superconductor comprising the steps of:
   placing a pellet consisting of $BaCu_3O_4$ on a powder consisting of $HoSrO_{2.5}$;
   heating the pellet and powder to approximately 950° C. to 1000° C. to form a melt at a pellet:powder interface; and
   removing a melted interface between the pellet and powder.

27. A process of making melt-produced superconductor components of arbitrary shape comprising the steps of:
   mixing and grinding $BaCO_3$ and $CuO$ in a nominal composition of $BaCu_3O_4$;
   heating the mixture in air at about 900° C. for about 12 hours, cooling the mixture, and grinding it;
   mixing and grinding $Y_2O_3$, $BaCO_3$, and $CuO$ in a nominal composition of $Y_{1.2}Ba_{0.8}CuO_{3.6}$;
   heating the mixture in air at about 950° C. for about 12 hours, then cooling it and grinding it;
   pressing the $BaCu_3O_4$ powder into an arbitrary shape and placing it onto the $Y_{1.2}Ba_{0.8}CuO_{3.6}$ powder;
   heating the $BaCu_3O_4$ and $Y_{1.2}Ba_{0.8}CuO_{3.6}$ in a furnace in flowing $O_2$ at about 950° C. for about 12 hours to form a melt at a shape:powder interface;
   holding the furnace at 650° C. for about 4 hours;
   cooling the furnace to less than 200° C. and removing from the furnace heated materials to bring them to room temperature; and
   separating a black melt-produced superconductor from the remaining $Y_{1.2}Ba_{0.8}CuO_{3.6}$ powder in which the superconductor is embedded.

28. The method of claim 27 including the step of removing excess $Y_{1.2}Ba_{0.8}CuO_{3.6}$ powder after separating the black melt-produced supeerconductor for re-use after regrinding.

29. A method for making a superconductor comprising the steps of:
   mixing and grinding $BaCO_3$ and $CuO$ with nominal compositions of at least one compound selected from the group consisting of $Ba_2Cu_3O_5$, $BaCu_3O_4$, $BaCu_4O_5$, $BaCu_6O_7$, and $BaCu_{12}O_{13}$;
   heating the resultant mixture to approximately 850° C. to about 920° C.;
   pressing the resultant mixture into a pellet;
   placing the pellet on a powder preheated to approximately 900° C. to about 1000° C., comprising $RBa_2Cu_3O_{4.5}F_4$ wherein R is chosen from the group consisting of: Gd, Ho, Er, Yb, Nd, Sm, Eu, Dy, Tm, and Lu;
   heating the pellet and the powder in a furnace to approximately 940° C. to about 1000° C.; and
   removing a melted interface between the pellet and powder.

30. A method for making a superconductor comprising the steps of:
   mixing and grinding $BaCO_3$ and $CuO$ with nominal compositions of at least one compound chosen from the group consisting of $Ba_2Cu_3O_5$, $BaCu_3O_4$, $BaCu_4O_5$, $BaCu_6O_7$, and $BaCu_{12}O_{13}$;
   heating the resultant mixture to approximately 850° C. to 920° C.;
   pressing the resultant mixture into a pellet;
   placing the pellet on a powder that has previously been heated to approximately 900° C. to about 1000° C., comprising $R_{1.2}Ba_{0.8}CuO_{3.6}$ wherein R is chosen from the group consisting of: Y, Gd, Er, Ho, Nd, Sm, Eu, Yb, Dy, Tm, and Lu;
   heating the pellet and the powder in a furnace to a temperature of greater than or equal to 950° C. and less than or equal to 1000° C. to form a melt at a pellet:powder interface; and
   removing a melt-produced superconductor from the powder in which the superconductor is embedded.

31. The method of claim 30 wherein after the pellet and powder are heated to 940°–1000° C. for a predetermined time in the furnace, the temperature of the furnace is lowered to approximately 650° C. and the pellet and mixture remain therein for a predetermined time.

32. The method of claim 30 wherein the pellet and powder are heated in the furnace at a temperature between 940° C. to about 1000° C. for approximately 12 to about 24 hours.

33. A method for making a superconductor comprising the steps of:
   mixing and grinding $BaCO_3$ and $CuO$ with nominal compositions of at least one compound chosen from the group consisting of $BaCu_3O_5$, $Ba_2Cu_3O_4$, $BaCu_4O_5$, $BaCu_6O_7$, and $BaCu_{12}O_{13}$;
   heating the resultant mixture to a temperature of approximately 900° C.;
   pressing the resultant mixture into a pellet;
   placing the pellet on a powder preheated to approximately 900° C. to about 1000° C., comprising $Y_{1.2}Ba_{0.8}CuO_{3.6}$;
   heating the pellet and the powder in a furnace to a temperature of greater than or equal to 940° C. and less than or equal to 1000° C. for approximately 12 to about 24 hours to form a melt at a pellet:powder interface;
   cooling the furnace to approximately 650° C. and heating the pellet and powder therein;
   cooling the furnace to at least approximately 200° C.; and
   removing a melted interface between the pellet and powder.

34. A process of making melt-produced superconductor components comprising the steps of:
   mixing and grinding $BaCO_3$ and $CuO$ in a nominal composition of $BaCu_3O_4$;
   heating the mixture in air at about 900° C. for about 12 hours, cooling the mixture, and grinding it, and pressing it into a pellet;
   mixing and grinding $Y_2O_3$, $BaCO_3$, and $CuO$ in a nominal composition of $Y_{1.2}Ba_{0.8}CuO_{3.6}$;

heating the mixture in air at about 950° C. for about 12 hours, then cooling it and grinding it;

placing the resultant $BaCu_3O_4$ pellet onto the $Y_{1.2}Ba_{0.8}CuO_{3.6}$ powder;

heating the $BaCu_3O_4$ and $Y_{1.2}Ba_{0.8}CuO_{3.6}$ in flowing $O_2$ at about 950° C. for about 12 hours to form a melt at the pellet:powder interface;

holding the furnace at 650° C. for about 4 hours;

cooling the furnace to less than 200° C. and removing from the furnace the heated materials to bring them to room temperature; and separating a black melt-produced superconductor from the remaining $Y_{1.2}Ba_{0.8}CuO_{3.6}$ powder.

35. A process for making melt-produced superconductor components of arbitrary shape comprising the steps of:

mixing and grinding $BaCO_3$ and CuO in a nominal composition of $BaCu_3O_4$;

heating the mixture in air at about 900° C. for about 12 hours, cooling the mixture, and grinding it;

mixing and grinding $Y_2O_3$, $BaCO_3$, and CuO in a nominal composition of $Y_{1.2}Ba_{0.8}CuO_{3.6}$ powder;

heating the mixture in air at about 950° C. for about 12 hours, then cooling it and grinding it;

pressing the $BaCu_3O_4$ powder into an arbitrary shape and placing it onto the $Y_{1.2}Ba_{0.8}CuO_{3.6}$ powder;

heating the $BaCu_3O_4$ and $Y_{1.2}Ba_{0.8}CuO_{3.6}$ in flowing $O_2$ at about 950° C. for about 12 hours to form a melt at the pellet:powder interface;

holding the furnace at 650° C. for about 4 hours;

cooling the furnace to less than 200° C. and removing from the furnace the heated materials to bring them to room temperature; and separating a black melt-produced superconductor from the remaining $Y_{1.2}Ba_{0.8}CuO_{3.6}$ powder in which the superconductor is embedded.

* * * * *